(12) United States Patent
Imaoka et al.

(10) Patent No.: US 8,110,895 B2
(45) Date of Patent: Feb. 7, 2012

(54) CIRCUIT SUBSTRATE STRUCTURE AND CIRCUIT APPARATUS

(75) Inventors: Toshikazu Imaoka, Ogaki (JP); Tetsuro Sawai, Hashima (JP); Atsushi Saita, Kobe (JP); Takeshi Yamaguchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/789,341

(22) Filed: May 27, 2010

(65) Prior Publication Data

US 2010/0315790 A1 Dec. 16, 2010

Related U.S. Application Data

(62) Division of application No. 11/336,091, filed on Jan. 20, 2006, now Pat. No. 7,750,434.

(30) Foreign Application Priority Data

| Jan. 31, 2005 | (JP) | 2005-024422 |
| Feb. 18, 2005 | (JP) | 2005-041522 |
| Jul. 29, 2005 | (JP) | 2005-220415 |
| Nov. 30, 2005 | (JP) | 2005-346371 |
| Nov. 30, 2005 | (JP) | 2005-346372 |

(51) Int. Cl.
*H01L 27/08* (2006.01)

(52) U.S. Cl. ............ 257/531; 257/E21.022; 257/536; 257/548; 336/200; 336/232; 333/25

(58) Field of Classification Search ........... 257/E21.022, 257/698, 531, 536, 548, E31.072, E21.338; 361/748; 174/260; 336/200, 232; 333/25; 438/132, 215, 281, 333, 467, 601
See application file for complete search history.

(56) References Cited

U.S. PATENT DOCUMENTS

| 5,095,357 | A | * | 3/1992 | Andoh et al. | 257/379 |
| 5,420,558 | A | * | 5/1995 | Ito et al. | 336/200 |
| 5,572,179 | A | * | 11/1996 | Ito et al. | 336/200 |

(Continued)

FOREIGN PATENT DOCUMENTS

JP 03-003395 1/1991

(Continued)

OTHER PUBLICATIONS

English-language translation of Japanese Office Action dated Apr. 12, 2011 issued in corresponding Japanese patent application No. 2005-346371.

*Primary Examiner* — Chris Chu
(74) *Attorney, Agent, or Firm* — Fish & Richardson P.C.

(57) ABSTRACT

A first wiring layer in a circuit substrate structure is provided with a first inductor and a second inductor. A dielectric layer is provided with a first via and a second via electrically connected to the first inductor and the second inductor, respectively. A second wiring layer is provided with: a bridge electrically connecting the first via and the second via; and a conductive pattern provided around the bridge, the outer edge of the conductive pattern being located outside the outer edge of the first wiring pattern and the second wiring pattern in the first wiring layer. The bridge functions as a coplanar line and suppresses generation of electromagnetic field.

12 Claims, 18 Drawing Sheets

U.S. PATENT DOCUMENTS

| | | | |
|---|---|---|---|
| 6,362,525 B1 * | 3/2002 | Rahim | 257/738 |
| 6,396,362 B1 | 5/2002 | Mourant et al. | 333/25 |
| 6,424,227 B1 * | 7/2002 | El-Sharawy | 330/307 |
| 6,585,165 B1 * | 7/2003 | Kuroda et al. | 235/492 |
| 6,661,306 B2 | 12/2003 | Goyette et al. | 333/25 |
| 6,800,936 B2 * | 10/2004 | Kosemura et al. | 257/748 |
| 6,900,536 B1 * | 5/2005 | Derbenwick et al. | 257/724 |
| 6,917,095 B1 | 7/2005 | Wong et al. | 257/548 |
| 7,236,080 B2 | 6/2007 | Kyriazidou et al. | 336/200 |
| 7,274,268 B2 * | 9/2007 | Vice et al. | 333/26 |
| 7,432,580 B2 * | 10/2008 | Sato et al. | 257/516 |
| 7,642,618 B2 * | 1/2010 | Shiramizu et al. | 257/531 |
| 2002/0003281 A1 | 1/2002 | Ibata et al. | 257/531 |
| 2002/0005565 A1 | 1/2002 | Forbes et al. | 257/531 |

FOREIGN PATENT DOCUMENTS

| | | |
|---|---|---|
| JP | 2001-332931 | 11/2001 |
| JP | 2003-243570 | 8/2003 |
| JP | 2004-087524 | 3/2004 |
| JP | 2005-183890 | 7/2005 |

* cited by examiner

CIRCUIT SUBSTRATE STRUCTURE AND CIRCUIT APPARATUS

CROSS REFERENCE TO RELATED APPLICATIONS

This application is a divisional of U.S. patent application Ser. No. 11/336,091, filed Jan. 20, 2006, which in turn claims the benefit of Japanese Patent Application No. 2005-024422, filed Jan. 31, 2005, Japanese Patent Application No. 2005-041522, filed Feb. 18, 2005, Japanese Patent Application No. 2005-220415, filed Jul. 29, 2005, Japanese Patent Application No. 2005-346371, filed Nov. 30, 2005, and Japanese Patent Application No. 2005-346372, filed Nov. 30, 2005.

BACKGROUND OF THE INVENTION

1. Field of the Invention

The present invention generally relates to a circuit substrate structure on which to mount IC chips and the like and, more particularly, to a circuit substrate structure having multiple wiring layers.

The present invention also relates to a circuit apparatus in which IC chips (circuit elements) and the like are mounted on a circuit substrate structure provided with multiple wiring layers.

2. Description of the Related Art

It has become common to provide a cell phone with a variety of additional features other than communication functions. A multi-featured cell phone is valued highly in the market and can establish itself as a highly popular model. Particularly in recent years, cell phones with a built-in FM tuner for receiving radio broadcast are gaining popularity. Manufacturers are making efforts to reduce the size of an FM tuner.

An FM tuner requires two spiral coil patterns in an oscillation circuit. There is proposed in the related art a high-frequency oscillation circuit in which a maximum oscillation frequency is improved by using a MOS transistor in which a bulk potential is controllable, instead of using a diode (see, for example, patent document 1). There is a also proposed a circuit substrate structure provided with an LC circuit formed such that the peripheries of multiple coil patterns face opposite to each other across a dielectric (see, for example, patent document 2).
[Patent Document No. 1]
JP 2001-332931 A
[Patent Document No. 2]
JP 2004-87524 A In forming two coil patterns on a wiring layer and fabricating a circuit substrate structure in which an end of a coil pattern is connected to an end of the other coil pattern, a via is formed in a dielectric layer underlying the wiring layer to extend to another wiring layer underlying the dielectric layer. A bridge electrically connects between vias. Due to electromagnetic field produced around the bridges and the coil patterns, the operating performance of a nearby circuit may be adversely affected.

For example, when a circuit substrate structure is mounted on aboard such that the side provided with a bridge faces downward, electromagnetic interference with wirings formed on the surface of the board or in the neighborhood thereof causes variation in the operating performance of the circuit substrate structure. In this case, wirings formed on the board are also affected by electromagnetic interference from the bridges and the coil patterns in the circuit substrate structure. This may create difficulty in fixing the oscillation frequency of an oscillation circuit and prevent appropriate tuning.

One conceivable approach to address this situation is to suppress electromagnetic leakage from the bridges and the coil patterns by coating the entirety of a surface sealing the bridges with a conductive layer (ground). By forming a conductive layer on the entirety of the sealing surface, the number of steps is increased so that fabrication cost is increased accordingly. Another problem is that, by forming a conductive layer, the overall thickness of the circuit substrate structure is increased so that the requirement for miniaturization is not met.

The above-mentioned approach is capable of suppressing electromagnetic leakage to the board on which to mount the circuit substrate structure provided with the coil patterns but cannot successfully suppress electromagnetic leakage from the coil patterns in a direction away from the board. Depending on the condition in which the circuit substrate structure is built in an electronic appliance, the leakage may cause similar malfunction by creating electromagnetic interference with wirings formed in another board located in close proximity to the circuit substrate structure. One possible countermeasure to address this problem is to coat the entirety of a surface, which is opposite to the board on which to mount the circuit substrate structure provided with the coil patterns, with a conductive layer (ground), so as to suppress electromagnetic leakage from the coil patterns.

However, by forming a conductive layer on the entirety of the surfaces of the circuit substrate structure provided with the coil patterns, the number of steps is increased so that fabrication cost is increased accordingly. By forming a conductive layer on both surfaces of the circuit substrate structure, the number of wiring layers is increased so that the overall thickness of the circuit substrate structure is increased and the requirement for miniaturization is not met.

SUMMARY OF THE INVENTION

Thus, a purpose of the present invention is to suppress electromagnetic leakage from bridges or the like and provide a circuit substrate structure in which the requirement for miniaturization is met.

Another purpose of the present invention is to suppress electromagnetic leakage from coil patterns and provide a circuit apparatus in which the requirement for miniaturization is met.

In at least one embodiment of the present invention, the circuit substrate structure comprises: a first wiring layer comprising a first wiring pattern of a spiral configuration and a second wiring pattern of a spiral configuration; a dielectric layer provided with a first via and a second via which are electrically connected to the first wiring pattern and the second wiring pattern, respectively; a second wiring layer comprising: a bridge electrically connecting the first via and the second via; and a conductive pattern provided around the bridge, the outer edge of the conductive pattern being located outside the outer edge of the first wiring pattern and the second wiring pattern in the first wiring layer. If the circuit substrate structure is mounted on a board, the conductive pattern may serve the function of a grounded layer. The first wiring layer, the dielectric layer and the second wiring layer form a layered structure. The outer edges of the wiring patterns and the conductive pattern are defined with reference to a plane perpendicular to the direction of layering. The conductive pattern may be referred to as a conductive layer.

According to this aspect of the invention, the conductive layer suppresses leakage of electromagnetic field produced in the first wiring pattern and the second wiring pattern. By forming a conductive layer in the same layer as the bridge, the circuit substrate structure is slim sized. Electromagnetic leakage from the bridge is suppressed because the conductive pattern facilitates the bridge to function as a coplanar line.

Designating a direction from the center of the first wiring pattern to the center of the second wiring pattern as a first direction and a direction perpendicular to the first direction as a second direction, the length of the outer edge of each of the first wiring pattern and the second wiring pattern in the first direction may be shorter than the length of the outer edge in the second direction. In this case, the distance between the first via and the second via is reduced and the length of the bridge is reduced so that electromagnetic leakage from the bridge is further suppressed.

Instead of the bridge, the second wiring layer may be provided with a first electrode and a second electrode electrically connected to the first via and the second via, respectively. In this case, a gap area between the conductive pattern and each of the first electrode and the second electrode can be made smaller than a gap area between the conductive pattern and the bridge. Accordingly, leakage of electromagnetic field produced in the first wiring pattern and the second wiring pattern is further suppressed. The above approach allows a user to desirably set up the character of the bridge formed in a board on which to mount the circuit substrate structure. Therefore, flexibility in circuit design is improved.

In at least another embodiment of the present invention, the circuit substrate structure comprises: a first wiring layer comprising a predetermined wiring pattern; a dielectric layer provided with a via electrically connected to the predetermined wiring pattern; and a second wiring layer comprising: a bridge connected to the via; and a conductive pattern provided around the bridge, the outer edge of the conductive pattern being located outside the outer edge of the predetermined wiring pattern in the first wiring layer. If a circuit substrate structure is mounted on a board, the conductive pattern may serve the function of a grounded layer.

According to this aspect of the invention, the conductive layer suppresses leakage of electromagnetic field produced in the wiring pattern. By forming a conductive layer in the same layer as the bridge, the circuit substrate structure is slim sized.

In at least one embodiment of the present invention, the circuit apparatus comprises: a dielectric layer; a wiring layer provided on one surface of the dielectric layer and provided with a wiring pattern formed as a coil; and a circuit element superposed on the wiring pattern, the outer edge of the circuit element being located outside the outer edge of the wiring pattern in the wiring layer. The outer edges of the wiring patterns and the conductive pattern are defined with reference to a plane perpendicular to the direction of layering. The term "circuit apparatus" refers to a circuit substrate in which a circuit element is provided, a package substrate or a module substrate. The term "circuit element" refers to a semiconductor element such as an LSI chip. More particularly, it refers to a semiconductor element formed on a silicon substrate, an SiGe substrate or a GaAs substrate. The circuit element may be a passive element in which a passive circuit element is formed on an $Al_2O_3$ substrate. The term "wiring pattern formed as a coil" refers to a wiring pattern with a regular layout. For example, the wiring pattern may be laid out in a spiral configuration or a meandering configuration such that the width of wires and the interval between adjacent wires are uniform.

According to this aspect of the invention, the circuit element is capable of suppressing leakage of electromagnetic field produced in the wiring pattern. This is because electromagnetic field from the wiring pattern is contained as a result of the circuit element, characterized by a higher dielectric constant than air, being superposed on one of the surfaces of the wiring pattern. By covering the wiring pattern with a circuit element instead of covering the entirety of the wiring pattern with a conductive layer, the number of wiring layers is reduced by one so that the circuit apparatus is slim sized. Since the wiring pattern and the circuit element form a layered structure (superposed structure), the area occupied by the circuit apparatus is reduced as compared with a case where the wiring pattern and the circuit element are provided in different areas on the same plane.

The circuit apparatus may be provided with a protective layer covering the wiring layer. The circuit element may be provided above the protective layer via a non-conductive adhesive layer.

The circuit apparatus may further comprise another circuit element provided on the other surface of the dielectric layer at a position opposite to the wiring pattern via the dielectric layer. Alternatively, the circuit apparatus may further comprise: another wiring layer provided on the other surface of the dielectric layer and provided with a wiring pattern formed as a coil; and another circuit element superimposed on the wiring pattern in the another wiring layer, the outer edge of the another circuit element being located outside the outer edge of the wiring pattern in the another wiring layer. In this case, the wiring patterns are sandwiched by circuit elements on both sides. Therefore, electromagnetic leakage from the wiring patterns is suppressed in both directions.

The circuit apparatus may further comprise a first conductive layer provided with a conductive pattern provided on the other surface of the dielectric layer, the outer edge of the conductive pattern being located outside the outer edge of the wiring pattern in the wiring layer. The conductive pattern may be referred to as a conductive layer. If the circuit apparatus is mounted on a board, the conductive pattern may serve the function of a grounded layer. The first conductive layer, the dielectric layer, the wiring layer and the circuit element form a layered structure. Similarly to the outer edges of the wiring pattern and the circuit element, the outer edge of the conductive pattern is defined with reference to a plane perpendicular to the direction of layering. In this case, not only leakage of electromagnetic field produced in the wiring pattern outside a surface of the dielectric layer is suppressed by the circuit element but also electromagnetic leakage outside the other surface of the dielectric layer is suppressed by the conductive pattern.

The wiring pattern may comprise a first wiring pattern of a spiral configuration and a second wiring pattern of a spiral configuration. The dielectric layer may be provided with a first via and a second via electrically connected to the first wiring pattern and the second wiring pattern, respectively. The first conductive layer may be provided with a bridge electrically connecting the first via and the second via and a conductive pattern provided around the bridge, the outer edge of the conductive pattern being located outside the outer edge of the first wiring pattern and the second wiring pattern in the first wiring layer. Designating a direction from the center of the first wiring pattern to the center of the second wiring pattern as a first direction and a direction perpendicular to the first direction as a second direction, the length of the outer edge of each of the first wiring pattern and the second wiring pattern in the first direction may be shorter than the length of the outer edge in the second direction. In this case, the distance between the first via and the second via is reduced, and the length of the bridge is reduced so that electromagnetic leakage from the bridge is suppressed.

The circuit apparatus may further comprise a sealing resin for sealing the circuit element. In this case, leakage of electromagnetic field produced in the wiring pattern and passing through the circuit element is more effectively suppressed than when the sealing resin is not provided. This is due to the fact that the sealing resin, characterized by a dielectric constant higher than that of air, covers the wiring pattern.

The circuit element may be superposed on the wiring pattern and formed such that a first circuit element and a second circuit element are superposed on each other, the outer edge of the first circuit element being located outside the outer edge of the wiring pattern in the wiring layer and the outer edge of the second circuit element being arbitrarily located. In this case, the first circuit element having its outer edge located outside the outer edge of the wiring pattern in the wiring layer reduces the amount of electromagnetic leakage in the upward direction. In addition, the second circuit element located to cover the wiring pattern in the wiring layer reduces the amount of electromagnetic leakage in the upward direction. In the circuit apparatus as a whole, the amount of electromagnetic leakage is more successfully reduced than otherwise.

The second circuit element may be superposed on the first circuit element such that the outer edge of the second circuit element is located outside the outer edge of the wiring pattern in the wiring layer and inside the outer edge of the first circuit element. In this way, leakage of electromagnetic field produced in the wiring pattern is more effectively suppressed than when only one circuit element is provided, since electromagnetic field produced in the wiring patterns and passing through the first circuit element is blocked by the second circuit element covering the wiring pattern.

Since the wiring pattern and the two circuit elements form a layered structure (superposed structure), the area occupied by the circuit apparatus is reduced as compared with a case where the wiring pattern formed as a coil and the two circuit elements are provided in different areas on the same plane.

An advantage of the present invention is that it provides a circuit apparatus in which an oscillation frequency of an oscillation circuit is fixed and performance is stabilized irrespective of the condition in which the circuit apparatus is mounted on a board for actual use.

According to at least one embodiment of the present invention, it is possible to suppress electromagnetic leakage from bridges or the like and provide a circuit substrate structure in which the requirement for miniaturization is met.

According to at least one embodiment of the present invention, it is possible to suppress electromagnetic leakage from coil patterns and provide circuit apparatus in which the requirement for miniaturization is met.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
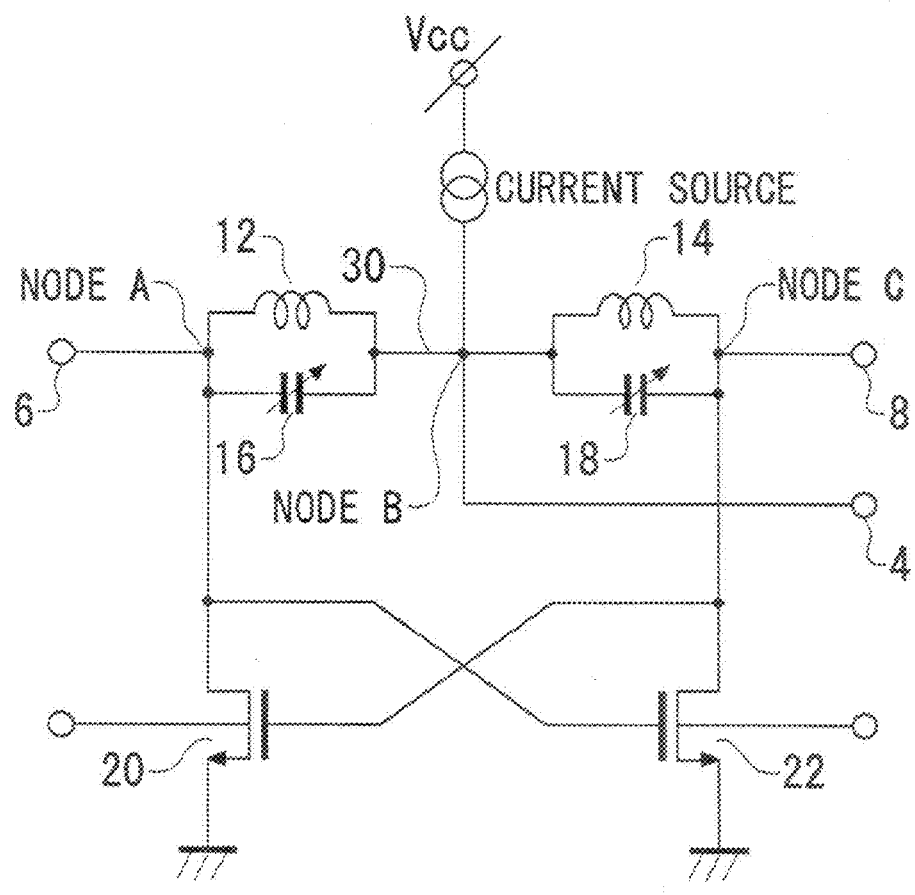
FIG. 1 is a circuit diagram of an oscillation circuit of an FM tuner apparatus according to a first embodiment.

The invention will now be described in more detail with reference to exemplary embodiments and the accompanying drawings. In the drawings, like elements are denoted by like numerals and the description there of may be omitted for brevity. In this specification, the term "upward" refers to a direction away from a dielectric layer and toward a wiring layer and circuit elements.

First Embodiment

FIG. 1 is a circuit diagram of an oscillation circuit of an FM tuner according to a first embodiment. An oscillation circuit 10 is provided with a first MOS transistor 20 and a second transistor MOS 22 for high-frequency oscillation. The circuit is also provided with a first inductor 12 and a first variable capacitor 16, a second inductor 14 and a second variable capacitor 18 constituting LC resonance circuits. An LC circuit including the first inductor 12 and the first variable capacitor 16 and an LC circuit including the second inductor 14 and the second variable capacitor 18 are connected in series via a bridge 30. By controlling a voltage applied at a control voltage input terminal 4, the capacitance of the first variable capacitor 16 and the second variable capacitor 18 is changed. This ensures that the oscillation frequency output from an output terminal 6 and an output terminal 8 is variable. Node connected to the output terminal 6 will be referred to as node A and node connected to the control voltage input terminal 4 as node B and node connected to the output terminal 8 as node C.

In the oscillation circuit 10 of the first embodiment, the first inductor 12, the second inductor 14 and the bridge 30 connecting the inductors are built in a circuit substrate structure on which to mount an IC chip (circuit element). The circuit substrate structure according to the first embodiment includes multiple wiring layers. In this specification, a layer in which the first inductor 12 and the second inductor 14 are formed will be referred to as "a first wiring layer" and a layer in which the bridge 30 is formed will be referred to as "a second wiring layer". A dielectric layer is provided between the first wiring layer and the second wiring layer. The other components, including the first variable capacitor 16 and the second variable capacitor 18, may be formed in an IC chip (circuit element). The IC chip (circuit element) and the circuit substrate structure constitute a package IC (circuit apparatus). A package IC may be referred to as an IC package.

Figure 2A:
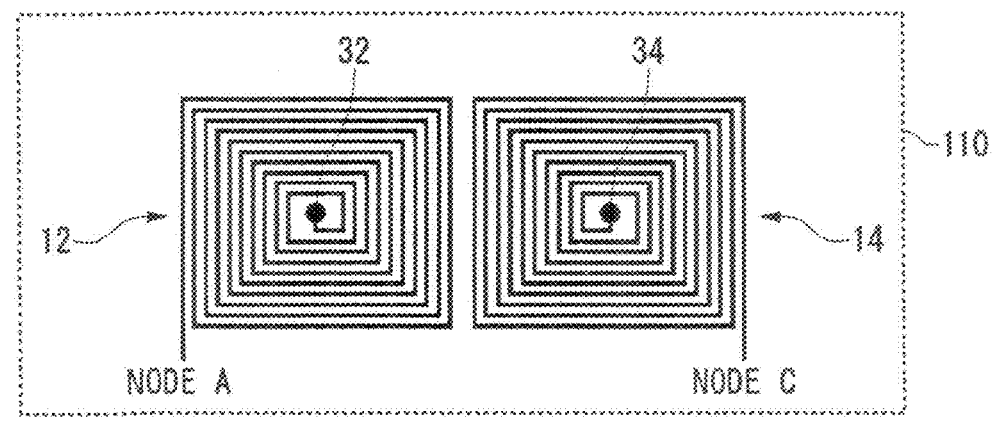
FIGS. 2A-2B are schematic views showing a relation between a first wiring layer and a second wiring layer in a circuit substrate structure.
Figure 2B:
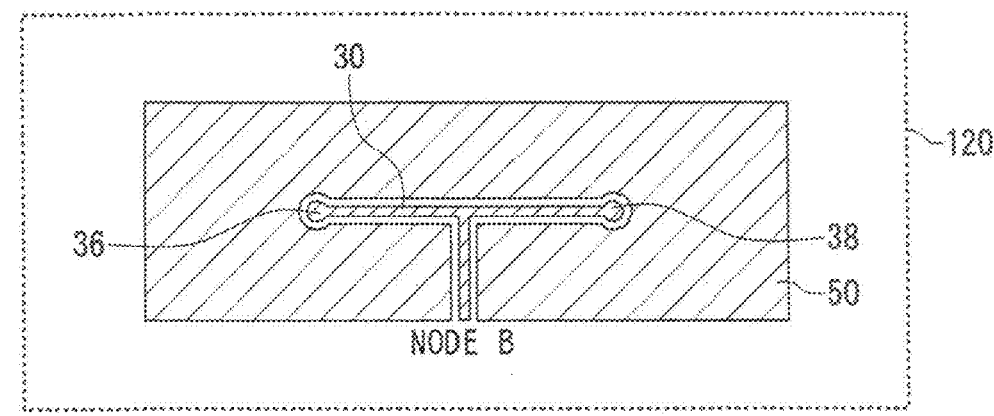

FIGS. 2A-2B are schematic views showing a relation between the first wiring layer and the second wiring layer. A first wiring layer 110 and a second wiring layer 120 are provided in a circuit substrate structure 100. In the first wiring layer 110, the first inductor 12 and the second inductor 14 are provided to be parallel with each other. The first inductor 12 is formed as a first wiring pattern of a spiral configuration and the second inductor 14 is also formed as a second wiring pattern of a spiral configuration. The first wiring pattern and the second wiring pattern are formed to have identical characteristics. In this case, the patterns are bilaterally symmetrical. The first wiring pattern and the second wiring pattern are identical in the number of turns of wires, width of wires and distance between wires. Both patterns also have identical inductance characteristics.

A first end 32 of the first wiring pattern 32 is located at the center of the first inductor 12. Similarly, a second end 34 of the second wiring pattern is located at the center of the second inductor 14. In the second wiring layer 120, the bridge 30 connects between the first end 32 and the second end 34. As described above, a dielectric layer (not shown) is located between the first wiring layer 110 and the second wiring layer 120. By forming a via at selected locations in the dielectric layer corresponding to the first end 32 and the second end 34, electric connection is established between the first end 32 and a first node 36 of the bridge 30 and between the second end 34 and a second node 38 of the bridge 30.

In the second wiring layer 120, a conductive pattern 50 is provided around the bridge 30. The outer edge of the conductive pattern 50 is located outside the outer edge of first wiring pattern of the first inductor 12 and the second wiring pattern of the second inductor 14. The outer edge of the first wiring pattern and the second wiring pattern is defined by a line delineating the periphery of first wiring pattern and the second wiring pattern viewed as an integral unit. Thus, in the first embodiment, the periphery of the conductive pattern 50 is designed to extend beyond the line delineating the periphery of the first wiring pattern and the second wiring pattern as a unit.

Figure 3:
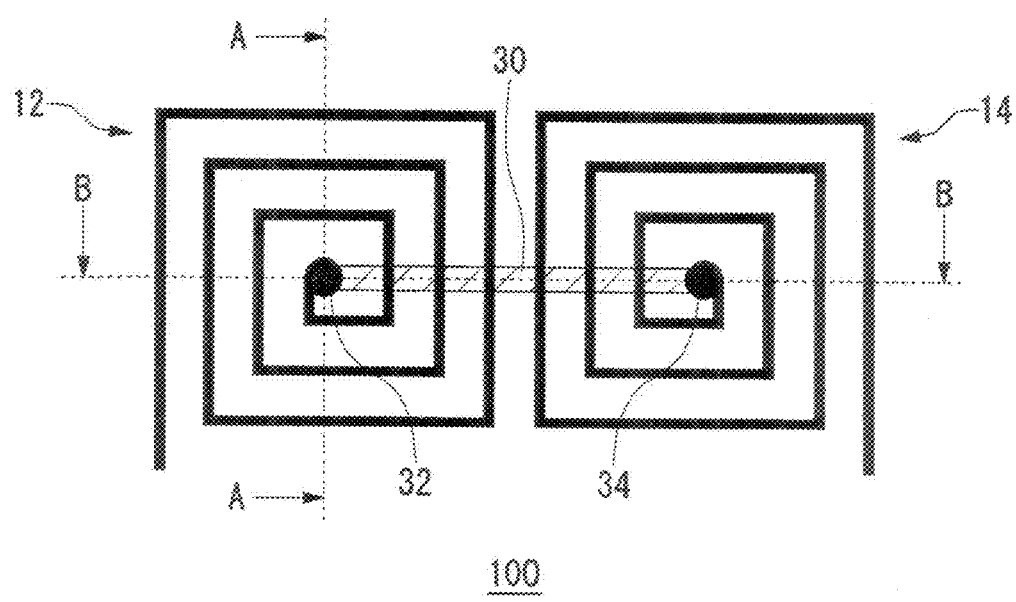
FIG. 3 is a schematic view showing a relation between a first inductor, a second inductor and a bridge in the circuit substrate structure.

FIG. 3 is a schematic view showing a relation between the first inductor, the second inductor and the bridge. In the circuit substrate structure 100, the bridge 30 electrically connects the first end 32 of the first inductor 12 with the second end 34 of the second inductor 14.

Figure 4:
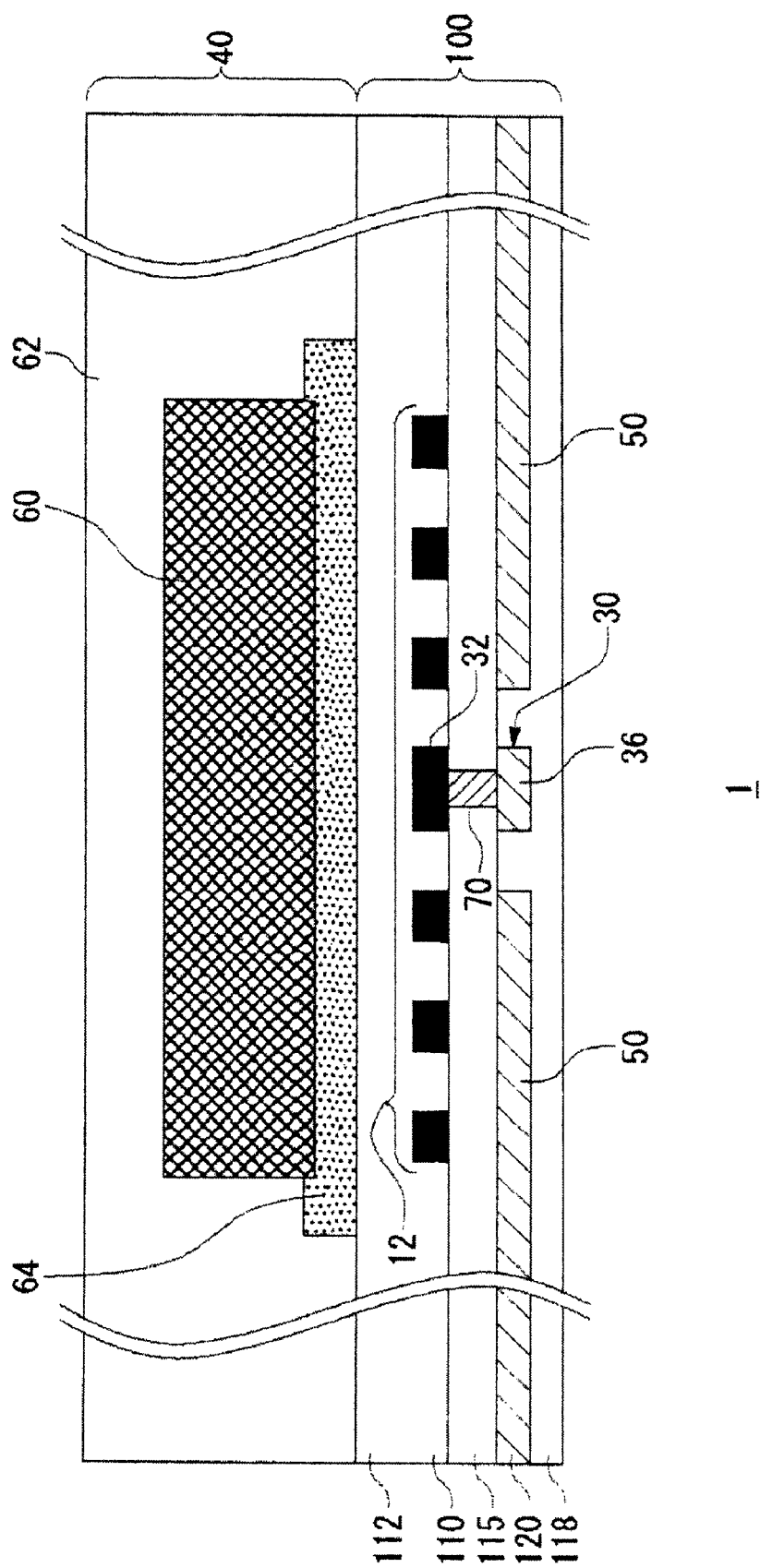
FIG. 4 is a sectional view of the structure of a package IC according to the first embodiment.

FIG. 4 is a sectional view of the structure of a package IC according to the first embodiment. A package IC 1 is provided with a circuit apparatus 40 and a circuit substrate structure 100. An IC chip (circuit element) 60 is fitted to the circuit substrate structure 100. A non-conductive die-attach sheet (adhesive layer) 64 is adhesively attached to the circuit substrate structure 100. The IC chip 60 is fixed on the die-attach sheet 64. The IC chip 60 is protected by a sealing resin layer 62. The IC chip 60 is electrically connected to the first wiring layer 110 by means of, for example, wire bonding (not shown).

FIG. 4 is an A-A section of the circuit substrate structure 100 of FIG. 3. The package IC 1 is formed such that the sealing resin 62, the IC chip 60, the die-attach sheet 64, a coating layer (protective layer) 112, the first wiring layer 110, a dielectric layer 115, the second wiring layer 120 and a coating layer 118 are built one on top of another in the stated order. The first inductor 12 is formed in the first wiring layer 110. A first via 70 provided in the dielectric layer 115 is electrically connected to the first end 32 of the first inductor 12. The other end of the first via 70 is electrically connected to the first node 36 of the bridge 30.

The outer edge of the IC chip 60 is outside the outer edge of the wiring pattern of the first inductor 12 in the first wiring layer 110. The outer edge of the first wiring pattern and the second wiring pattern is defined by a line delineating the periphery of first wiring pattern and the second wiring pattern viewed as an integral unit. Thus, in the first embodiment, the periphery of the IC chip 60 is designed to extend beyond the line delineating the periphery of the first wiring pattern and the second wiring pattern as a unit. That is, the IC chip 60 is located above the first wiring pattern of the first inductor 12. The IC chip 60 covering the wiring pattern of the first inductor 12 is of a dielectric constant higher than the sealing resin 62, which is of a dielectric constant of about 4. Therefore, the IC chip 60 is capable of absorbing and containing electromagnetic leakage from the first inductor 12. The IC chip may be a semiconductor element such as an LSI chip. More particularly, the IC chip may be a semiconductor element formed on a silicon substrate, an SiGe substrate or a GaAs substrate. Alternatively, the IC chip may be a passive element in which a passive circuit element is formed on an $Al_2O_3$ substrate. Since the major portion of the IC chip is occupied by a substrate material, the dielectric constant of the IC chip is about 12-13, which is approximately equal to the dielectric constant of the substrate material.

In the package IC 1 according to the first embodiment, the IC chip 60 suppresses electromagnetic leakage. Therefore, apart from the wiring pattern of the first inductor 12 and the IC chip 60, there is no need to provide extra measures for suppression of electromagnetic leakage such as a grounded conductive layer. Since the number of wiring layers is reduced by one, the process of fabricating the package IC 1 is simplified and slim sizing of the package IC 1 is achieved. Since the wiring pattern of the first inductor 12 and the IC chip 60 form a layered structure, the area occupied by the package IC 1 is reduced as compared with a case where the wiring pattern of the first inductor 12 and the IC chip 60 are provided in different areas on the same plane. If the lower surface or the underside of the IC chip 60 is a ground layer, the ground layer also serves to reduce electromagnetic leakage from the first inductor 12, enabling the IC chip 60 to suppress electromagnetic leakage more effectively. Only the protective layer and the adhesive layer are provided between the wiring pattern and the circuit element. Therefore, leakage of electromagnetic field from the wiring pattern is effectively suppressed by the circuit element without causing affecting another wiring layer.

In the second wiring layer 120, the bridge 30 and the conductive pattern 50 are formed. The outer edge of the conductive pattern 50 is located outside the outer edge of the wiring pattern of the first inductor 12 in the first wiring layer 110. That is, the conductive pattern 50 is formed to underlie the first wiring pattern of the first inductor 12. In this way, electromagnetic leakage from the first inductor 12 is successfully absorbed by the conductive pattern 50. In the circuit substrate structure 100 according to the first embodiment, the conductive pattern 50 suppresses electromagnetic leakage. Therefore, apart from the second wiring layer 120, there is no need to provide extra measures for suppression of electromagnetic leakage such as a grounded layer. Since the wiring layers comprise only two layers, the process of fabricating the circuit substrate structure 100 is simplified and slim sizing of the circuit substrate structure 100 is achieved. In the circuit substrate structure 100 for an FM tuner, the first inductor 12 and the second inductor 14 occupy major area. Therefore, a resultant electromagnetic field extends a considerable distance so that an external device is easily affected. While a primary role of the second wiring layer 120 is to accommodate the bridge 30, forming the conductive pattern 50 at a position correspond to the first inductor 12 and the second inductor 14 for suppression of adverse electromagnetic effects is highly beneficial in terms of fabrication cost.

Figure 5:
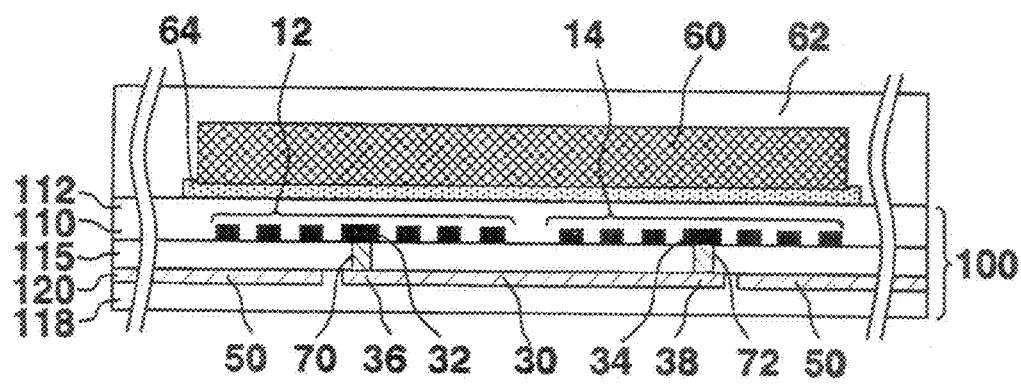
FIG. 5 is another sectional view of the structure of a package IC according to the first embodiment.

FIG. 5 is another sectional view of the structure of a package IC according to the first embodiment. FIG. 5 is a B-B section of the structure of FIG. 3. In the dielectric layer 115, the first via 70 for electrically connecting the first end 32 of the first inductor 12 and the first node 36 of the bridge 30 is provided. A second via 72 for electrically connecting the second end 34 of the second inductor 14 and the second node 38 of the bridge 30 is provided. In this way, the bridge 30 establishes wire connection between the first inductor 12 and the second inductor 14.

By forming the IC chip 60 to be large enough to encompass the wiring patterns of the first inductor 12 and the second inductor 14, the amount of electromagnetic field produced in the first inductor 12 and the second inductor 14 being leaked upward outside the protective layer 112 is reduced. In this way, the package IC, when fitted to a board and then built in an electronic appliance, is less affected than otherwise by interference from a wiring or circuit in an adjacent board. Accordingly, the oscillation circuit 10 is capable of producing a signal of a stable frequency.

By forming the conductive pattern 50 to be large enough to encompass the wiring patterns of the first inductor 12 and the second inductor 14, the amount of electromagnetic field produced in the first inductor 12 and the second inductor 14 being leaked downward outside the coating layer 118 is reduced. In this way, the package IC 1, when fitted to a board, is less affected than otherwise by interference from a wiring or circuit in a board. Accordingly, the oscillation circuit 10 is capable of producing a signal of a stable frequency.

In the circuit substrate structure 100 according to the first embodiment, the bridge 30 functions as a coplanar line by forming the conductive pattern 50 around the bridge 30. In this way, electromagnetic field produced in the bridge 30 is absorbed by the conductive pattern 50. Preferably, the characteristic impedance of the coplanar line is set lower than the characteristic impedance of the first inductor 12. As mentioned before, the first inductor 12 and the second inductor 14 are formed to be of the same structure except that they are bilaterally symmetrical. By setting the characteristic impedance of the coplanar line low, stable operation of the oscillation circuit 10 is guaranteed.

The characteristic impedance of the coplanar line is given by the following formula.

$$Z_0 = \sqrt{\frac{L}{C}}$$

Capacitance C depends on a gap between the bridge 30 and the conductive pattern 50. The larger the gap, the smaller the capacitance C. The smaller the gap, the larger the capacitance C. Accordingly, it is preferable that the gap between the bridge 30 and the conductive pattern 50 be as small as possible in order to reduce the characteristic impedance of the coplanar line.

Figure 6:
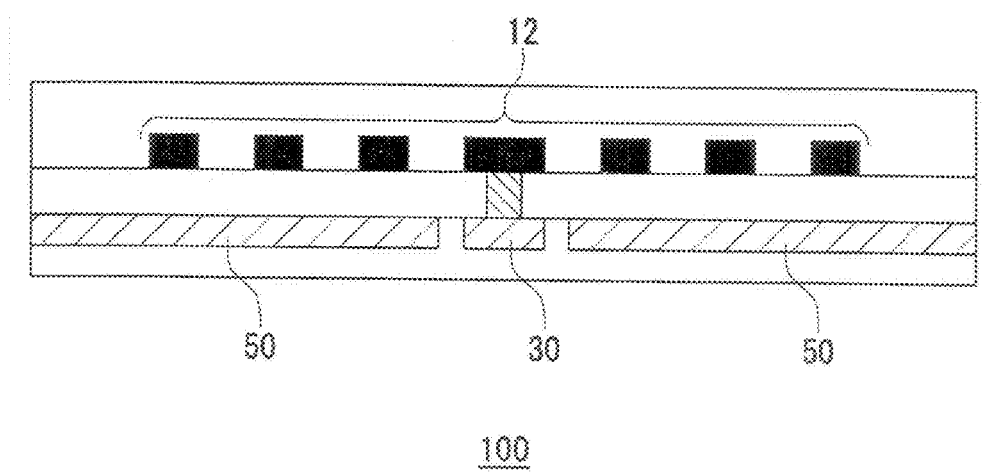
FIG. 6 is a sectional view of a variation of the structure of the circuit substrate structure.

FIG. 6 is a sectional view of a variation of the structure of the circuit substrate structure. In the circuit substrate structure shown in FIG. 6, the gap between the bridge 30 and the conductive pattern 50 is smaller than that of FIG. 4. In this way, the characteristic impedance of the coplanar line is reduced so that electromagnetic field leaked from the bridge 30 is easily absorbed by the conductive pattern 50.

In the second wiring layer 120, it is preferable that the gap between the bridge 30 and the conductive pattern 50 be set equal to or smaller than the distance between the wires of the first wiring pattern in the first wiring layer 110. By ensuring that the gap is equal to or smaller than the distance between the wires, the amount of electromagnetic field leaked from the first inductor 12 in the first wiring layer 110 is reduced. Thus, by narrowing an exit through which electromagnetic field escapes, the amount of electromagnetic field leaked is reduced. The amount of electromagnetic leakage from the bridge 30 is also reduced. This is due the fact that the function of the bridge as a coplanar line is enhanced by narrowing a gap.

Figure 7A:
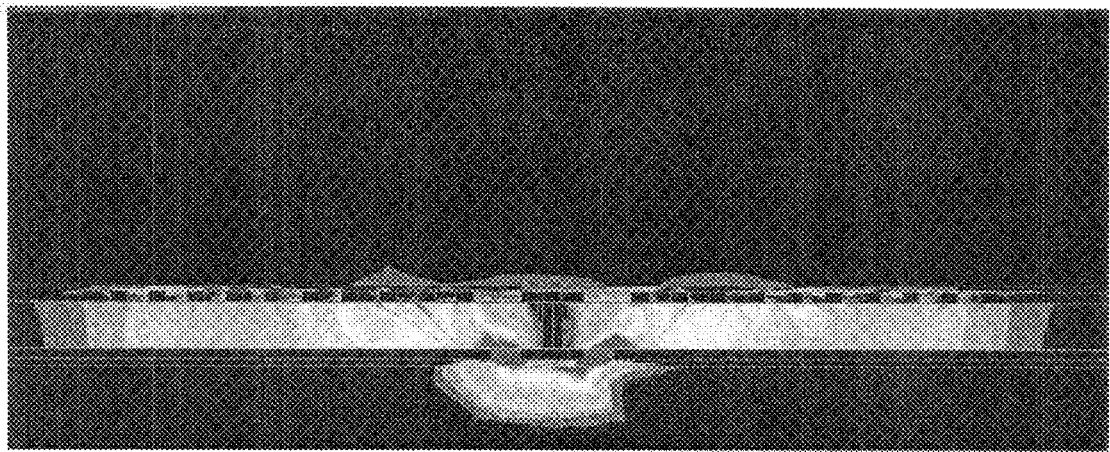
FIGS. 7A-7B show results of simulations of electromagnetic leakage performed for various gaps between a bridge and a conductive pattern.
Figure 7B:
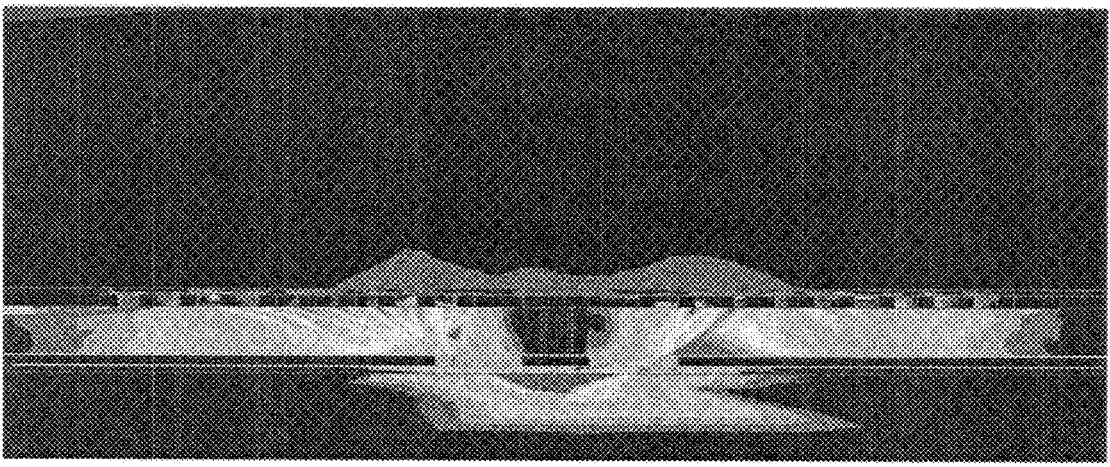

FIGS. 7A-7B show results of simulations of electromagnetic leakage performed for various gaps between the bridge and the conductive pattern. FIG. 7A shows electric field distribution in which the gap is relatively narrow. FIG. 7B shows electric field distribution in which the gap is wider than that of FIG. 7A. The simulation results show that the amount of electromagnetic leakage is reduced by narrowing the gap.

Figure 8A:
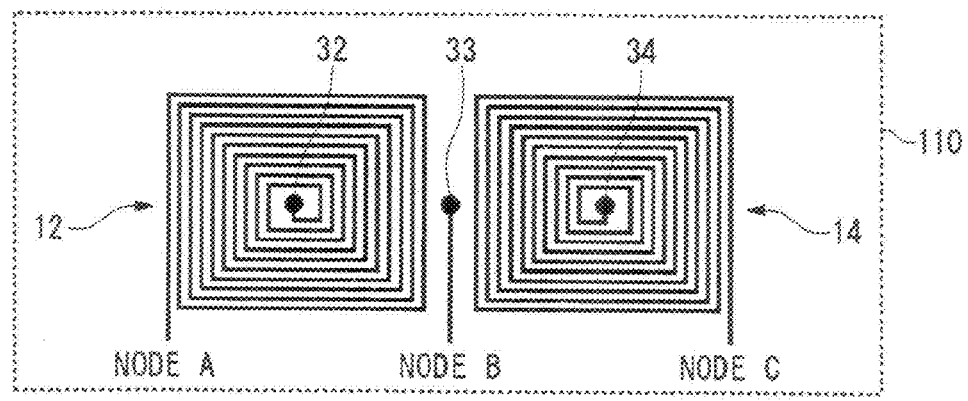
FIGS. 8A-8B show a variation of the relation between the first wiring layer and the second wiring layer shown in FIGS. 2A-2B.
Figure 8B:
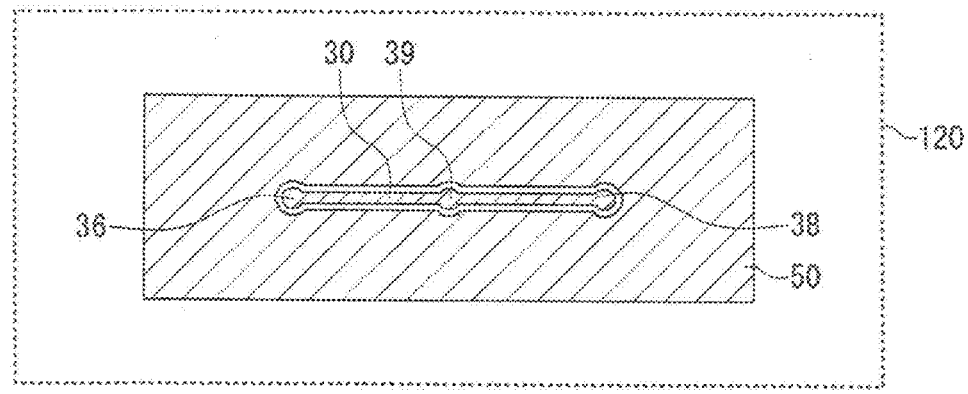

FIGS. 8A-8B show a variation of the relation between the first wiring layer and the second wiring layer shown in FIGS. 2A-2B. The first wiring layer 110 and the second wiring layer 120 are provided in the circuit substrate structure 100. In the first wiring layer 110, the first inductor 12 and the second inductor 14 are provided to be parallel with each other. The first end 32 is connected through a via to the first node 36. The second end 34 is connected through a via to the second node 38. In the second wiring layer 120, the bridge 30 establishes wire connection between the first end 32 and the second end 34.

In this variation, a third via is formed in the dielectric layer 115 to connect a third node 39 in the bridge 30 to a node 33 in the first wiring layer 110. In this way, node B connected to the control voltage input terminal 4 can be formed on the first wiring layer 110. As described above, the first inductor 12 and the second inductor 14 are formed to be bilaterally symmetrical. It is preferable therefore that the third node 39 be formed at a midpoint between the first node 36 and the second node 38 and the node 33 be formed at a midpoint between the first end 32 and the second end 34.

Providing a line leading to node B in the first wiring layer 110 reduces the number of lines exposed in the second wiring layer 120, which faces the board when the circuit substrate structure is mounted on the board. In this way, the amount of electromagnetic field leakage outside the circuit substrate structure 100 is reduced and effects from electromagnetic field outside the circuit substrate structure 100 are also reduced.

Figure 9A:
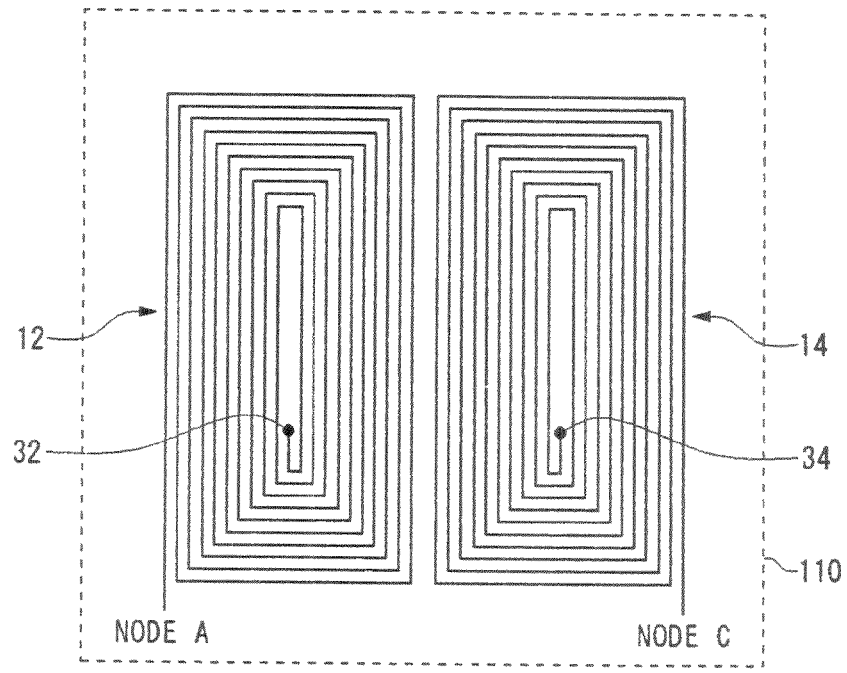
FIGS. 9A-9B show a variation of the relation between the first wiring layer and the second wiring layer shown in FIGS. 2A-2B.
Figure 9B:
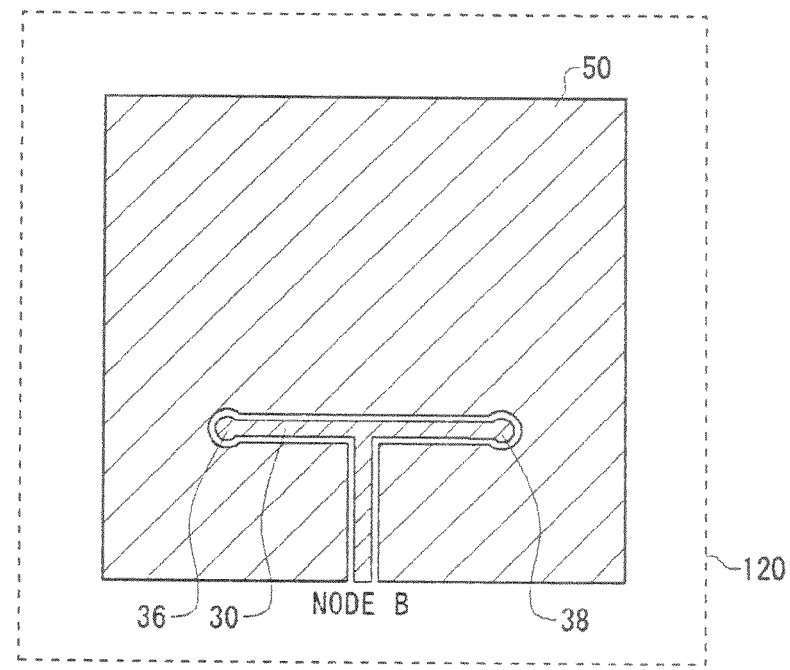

FIGS. 9A-9B show a variation of the relation between the first wiring layer and the second wiring layer shown in FIGS. 2A-2B. The circuit substrate structure 100 according to this variation differs from the structure of FIGS. 2A-2B in respect of the following two points. Firstly, the outer edge of each of the first inductor 12 and the second inductor 14 forms a rectangle with its horizontal side shorter than its vertical side. The term "horizontal" refers to a direction connecting the first end 32 and the second end 34 in the first wiring layer 110. The term "vertical" refers to a direction perpendicular to the horizontal direction. By allowing the outer edge of each of the first inductor 12 and the second inductor 14 to form a rectangle with its horizontal side shorter than its vertical side, the distance between the first via 70 and the second via 72 is reduced as compared to a case where the inductor patterns are square-shaped. Accordingly, the length of the bridge 30 in the second wiring layer 120 is reduced so that electromagnetic leakage from the bridge 30 is further suppressed. Further, the aforementioned approach creates a space in which to move the first end 32 of the first inductor 12 and the second end 34 of the second inductor 14 in a vertical direction. Accordingly, the inductance of the first inductor 12 and the second inductor 14 can be adjusted by adjusting the position of the first end 32 and the second end 34 in the vertical direction. A second difference is that the position of the first end 32 of the first inductor 12 and the position of the second end 34 of the second inductor 14 are below the center of the first inductor 12 and the center of the second inductor 14, respectively, in the first wiring layer as viewed from above. In this case, the length of the bridge 30 extending in the second wiring layer 120 to node B is reduced as compared to a case where the position of the first end 32 and the position of the second end 34 are located at the center of the first inductor 12 and the center of the second inductor 14, respectively. Accordingly, electromagnetic leakage from the bridge 30 is further suppressed.

Figure 10A:
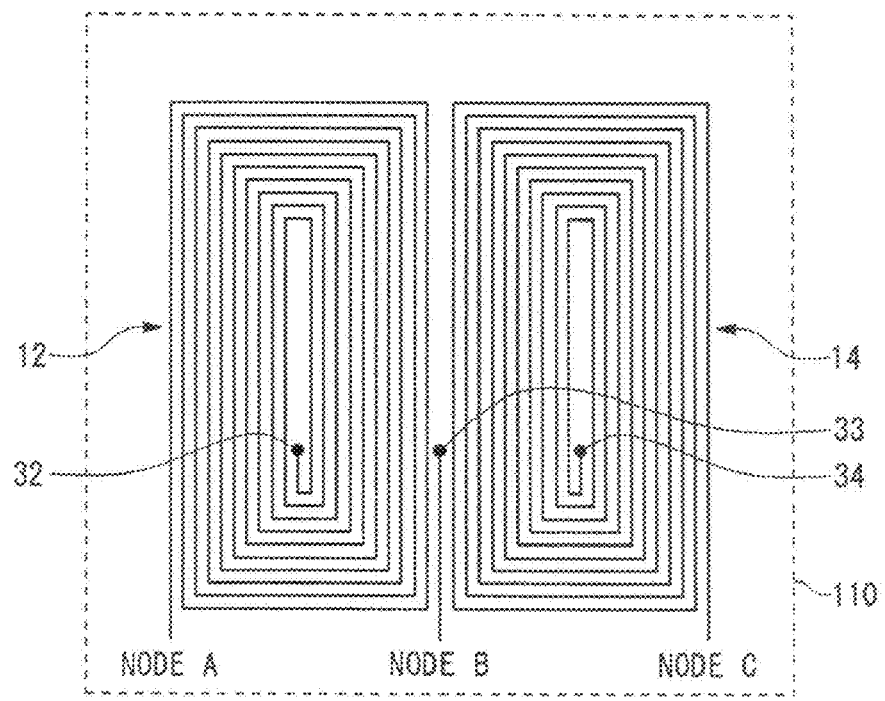
FIGS. 10A-10B show a variation of the relation between the first wiring layer and the second wiring layer shown in FIGS. 9A-9B.
Figure 10B:
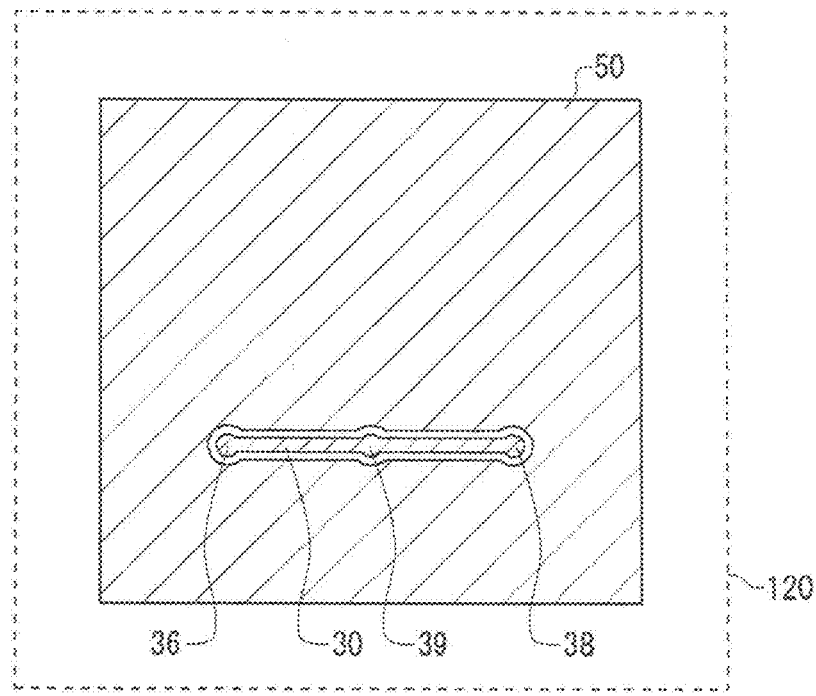

FIGS. 10A-10B show a variation of the relation between the first wiring layer and the second wiring layer shown in FIGS. 9A-9B. Similar to the variation shown in FIGS. 8A-8B, node B connected to the control voltage input terminal 4 is formed on the first wiring layer 110. Therefore, the number of lines exposed in the second wiring layer 120, which faces the board when the circuit substrate structure is mounted on the board, is reduced. In this way, the amount of electromagnetic field leakage outside the circuit substrate structure 100 is reduced and effects from electromagnetic field outside the circuit substrate structure 100 are also reduced.

Figure 11A:
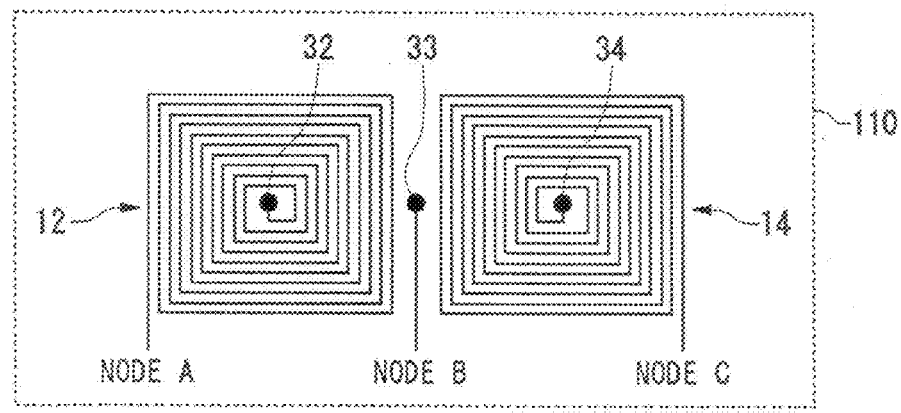
FIGS. 11A-11C show a variation of the relation between the first wiring layer and the second wiring layer shown in FIGS. 8A-8B and are schematic views showing a relation with a board on which to mount the circuit substrate structure.
Figure 11B:
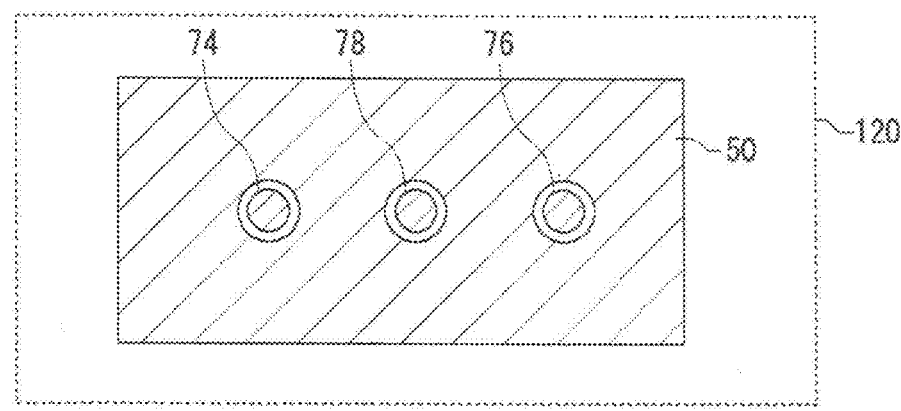
Figure 11C:
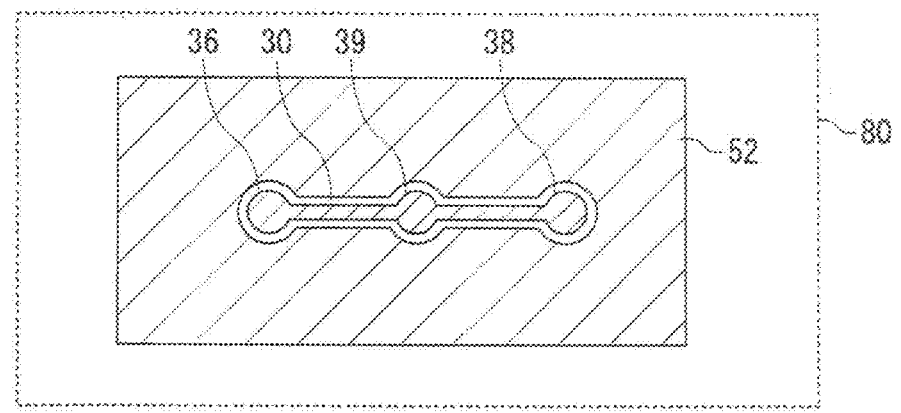

FIGS. 11A-11C show a variation of the relation between the first wiring layer and the second wiring layer shown in FIGS. 8A-8B and are schematic views showing a relation with a board on which to mount the circuit substrate structure. The first wiring layer 110 is of the same structure as described with reference to FIGS. 8A-8B. The structure of FIGS. 11A-11C differs from the structure of FIGS. 8A-8B in respect of the following two points. Firstly, the bridge 30 is replaced by a first electrode 74, a second electrode 76 and a third electrode 78, which are electrically connected to the first via 70, the second via 72 and a third via, respectively. Another difference is that the bridge 30 is formed on a board 80 on which to mount the circuit substrate structure 100. In the board 80, a conductive pattern 52 is provided around the bridge 30.

Figure 12:
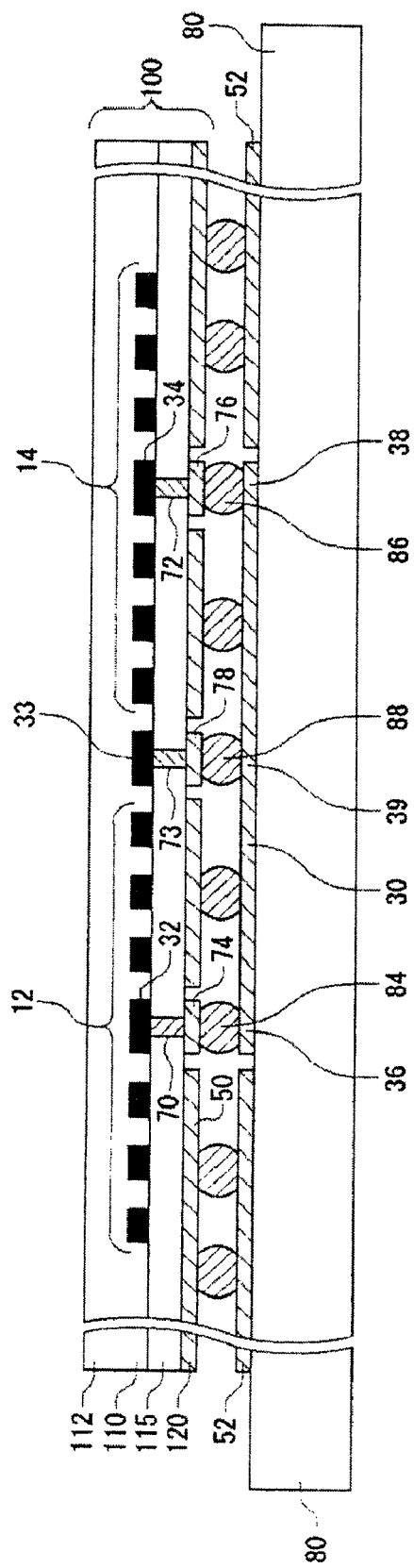
FIG. 12 is a sectional view of the structure of the first wiring layer, the second wiring layer and the board shown in 11A-11C.

FIG. 12 is a sectional view of the structure of the first wiring layer, the second wiring layer and the board shown in FIGS. 11A-11C. The cross section of FIG. 12 corresponds to the B-B section of the structure of FIG. 3. The circuit substrate structure 100 is formed such that the coating layer 112, the first wiring layer 110, the dielectric layer 115 and the second wiring layer 120 are built one on top of another in the stated order. The first inductor 12 and the second inductor 14 are formed in the first wiring layer 110. The first via 70, the second via 72 and the third via 73 are provided in the dielectric layer 115. In the second wiring layer 120, the first electrode 74, the second electrode 76, the third electrode 78 and the conductive pattern 50 are formed. The outer edge of the conductive pattern 50 is located outside the outer edge of first wiring pattern of the first inductor 12 and the second wiring pattern of the second inductor 14 in the first wiring layer. That is, the conductive pattern 50 is formed to underlie the first wiring pattern of the first inductor 12 and the second wiring pattern of the second inductor 14. If the circuit substrate structure 100 is mounted on the board 80, the conductive pattern 50 may serve the function of a grounded layer.

The first via 70 electrically connects the first end 32 of the first inductor 12 with the first electrode 74. The second via 72 electrically connects the second end 34 of the second inductor 14 with the second electrode 76. The third via 73 electrically connects the end 33 in the first wiring layer 110 with the third electrode 78. The bridge 30 is formed on the board 80. The second wiring layer 120 and the board 80 are electrically connected to each other by solder bumps. A first solder bump 84 electrically connects the first electrode 74 and the first node 36 of the bridge 30. A second solder bump 86 electrically connects the second electrode 76 and the second node 38 of the bridge 30. A third solder bump 88 electrically connects the third electrode 78 and the third node 39 of the bridge 30.

According to the variation shown in FIGS. 11A-11C and FIG. 12, a gap area between the conductive pattern 50 and each of the first electrode 74, the second electrode 76 and the third electrode 78 in the second wiring layer 120 facing the board when mounted can be made smaller than a gap area between the conductive pattern 50 and the bridge 30. As a result, the amount of electromagnetic field leakage outside the circuit substrate structure 100 is reduced. Effects from electromagnetic field outside the circuit substrate structure 100 are also reduced. In the example illustrated in FIGS. 11A-11C, the bridge 30 provided on the board 80 connects the first node 36, the second node 38 and the third node 39 with a straight line. Alternatively, the bridge 30 may be formed on the board 80 as desired by a user. That is, extensive design flexibility is enjoyed in that the character of the bridge 30 may be set up as desired by externally fitting components between the nodes or by providing curved routing of the bridge 30.

Second Embodiment

Figure 13:
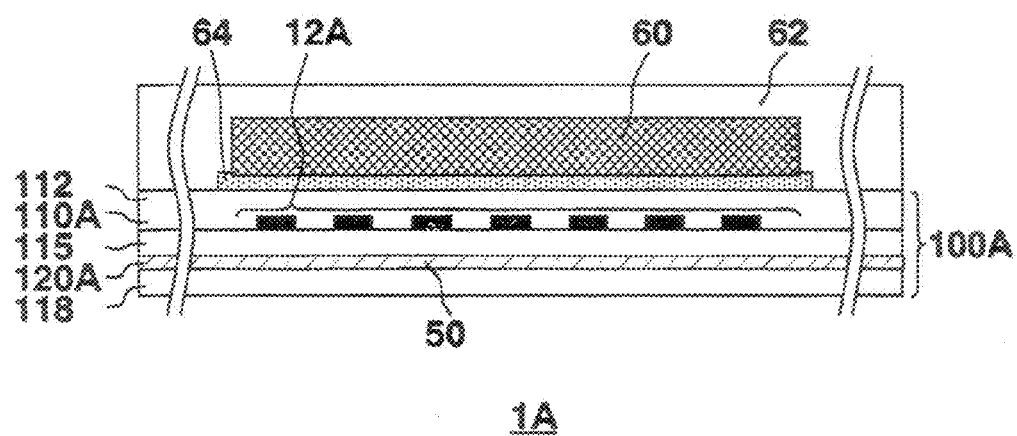
FIG. 13 is a sectional view showing the structure of a package IC according to a second embodiment.

FIG. 13 is a sectional view showing the structure of a package IC (circuit apparatus) 1A according to a second embodiment. A difference from the first embodiment is that a meander coil pattern instead of a spiral coil pattern is used and the bridge is not exposed in the second wiring layer. The other aspects of the second embodiment are the same as the corresponding aspects of the first embodiment. The second wiring layer may be referred to as a first conductive layer.

The package IC 1A according to the second embodiment is formed such that the sealing resin 62, the IC chip 60, the die-attach sheet 64, and a circuit apparatus substrate 100A are built on top of another in the stated order. The circuit apparatus substrate 100A comprises the coating layer (protective layer) 112, a first wiring layer 110A, the dielectric layer 115, a first conductive layer 120A and the coating layer 118 are built one on top of another in the stated order. In the first wiring layer 110A, a third inductor 12A of a meandering configuration is formed.

The outer edge of the IC chip 60 is located outside the outer edge of the wiring pattern of the third inductor 12A in the first wiring layer 110A. That is, the IC chip 60 is located above the third wiring pattern of the third inductor 12A. The IC chip 60 covering the wiring pattern of the third inductor 12A is of a dielectric constant higher than the sealing resin 62, which is of a dielectric constant of about 4. Therefore, the IC chip 60 is capable of absorbing and containing electromagnetic leakage from the third inductor 12A. Similarly to the first embodiment, since the number of wiring layers is reduced by one, the process of fabricating the package IC 1A is simplified and slim sizing of the package IC 1A is achieved. Since the wiring pattern of the third inductor 12A and the IC chip 60 form a layered structure, the area occupied by the package IC is reduced as compared with a case where the wiring pattern of the third inductor 12A and the IC chip 60 are provided in different areas on the same plane.

In the second embodiment, the outer edge of the conductive pattern 50 is outside the outer edge of the third wiring patter of the third inductor 12A. Since the entirety of the surface of the coil pattern of a meandering configuration facing the board is covered by the conductive pattern 50, electromagnetic leakage from the coil pattern is suppressed. In this way, the amount of electromagnetic field leakage outside the package IC 1A is reduced and effects from electromagnetic field outside the package IC 1A are reduced.

Figure 14A:
FIGS. 14A-14B show results of simulations of electromagnetic leakage performed when an IC chip is mounted on a coil pattern.
Figure 14B:
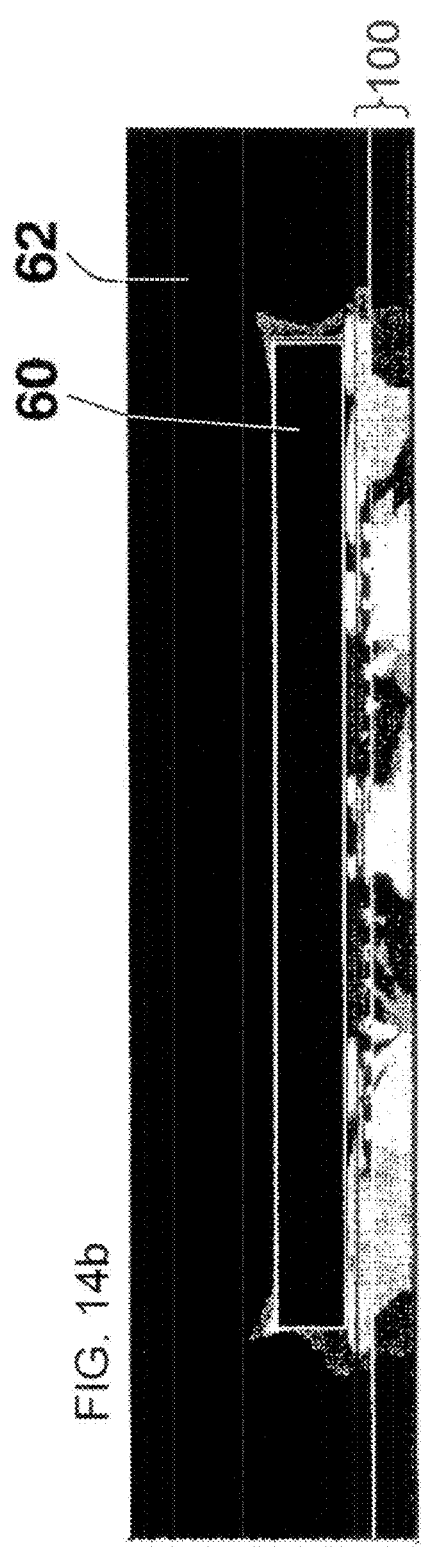

FIGS. 14A-14B show results of simulations of electromagnetic leakage performed when an IC chip is mounted on a coil pattern. FIG. 14A shows electric field distribution when the IC chip 60 is not mounted. FIG. 14B shows electric field distribution when the IC chip 60 is mounted. The simulation results show that the amount of electromagnetic leakage is reduced by mounting the IC chip 60.

Third Embodiment

Figure 15:
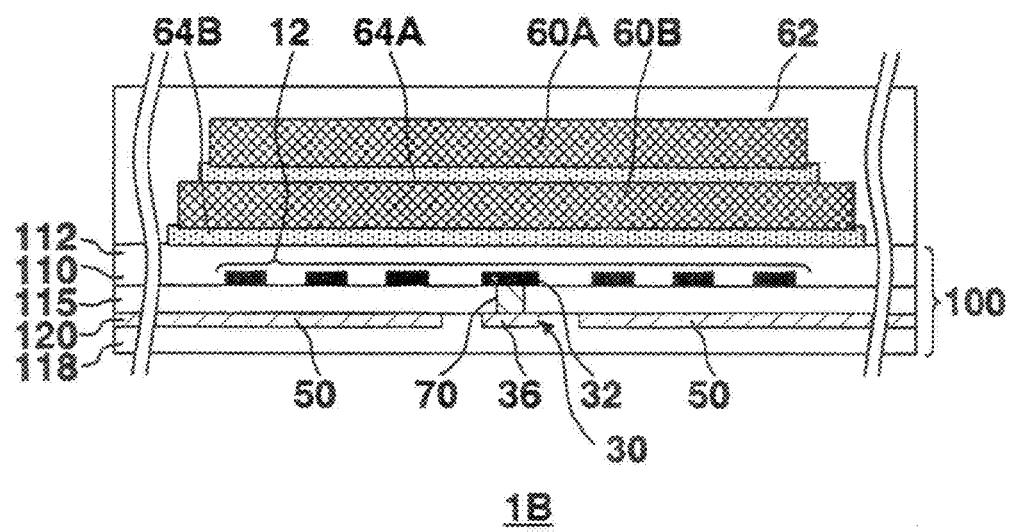
FIG. 15 is a sectional view showing the structure of a package IC according to a third embodiment.
Figure 16:
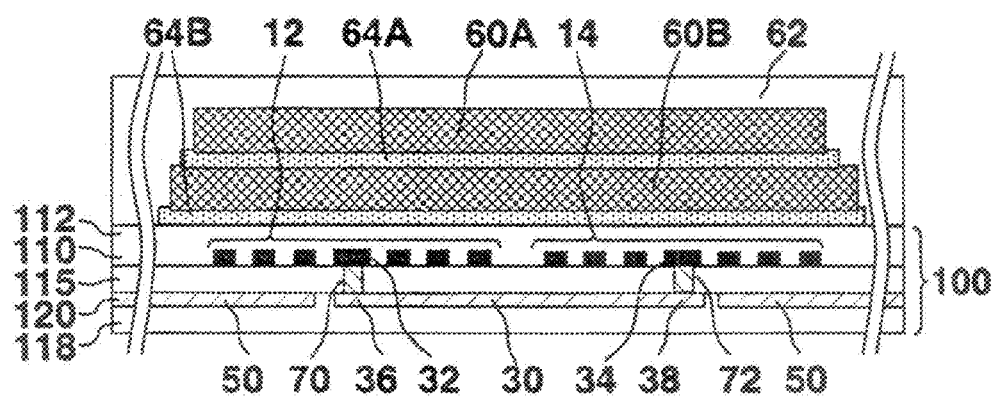
FIG. 16 is a sectional view showing the structure of a package IC according to a third embodiment.

FIGS. 15 and 16 are sectional views showing the structure of a package IC according to a third embodiment. The cross section of FIG. 15 corresponds to the A-A section of the structure of FIG. 3 and the cross section of FIG. 16 corresponds to the B-B section of the structure of FIG. 3. A difference from the first embodiment is that the IC chip 60 is formed of an IC chip 60B and an IC chip 60A located inside the outer edge of the IC chip 60B. The other aspects of the second embodiment are the same as the corresponding aspects of the first embodiment.

A package IC (circuit apparatus) 1B according to the third embodiment is formed such that the sealing resin 62, the IC chip 60A, the die-attach sheet 64A, the IC chip 60B, the die-attach sheet 64B, the coating layer (protective layer) 112, the first wiring layer 110, the dielectric layer 115, the first conductive layer 120 and the coating layer 118 are built one on top of another in the stated order. A non-conductive die-attach sheet (adhesive layer) 64A is adhesively attached to the IC chip 60B and the IC chip 60A is secured on the die-attach sheet 64A. The IC chip 60A and the IC chip 60B are electrically connected to each other and to the first wiring layer 110 by metal wiring such as wire bonding (not shown).

The periphery of each of the IC chip 60A and the IC chip 60B is designed to extend beyond the line delineating the periphery of the wiring patterns of the first inductor 12 and the second inductor 14 in the first wiring layer 110. That is, the IC chip 60A and the IC chip 60B are located above the wiring patterns of the first inductor 12 and the second inductor 14. Thus, leakage of electromagnetic field produced in the wiring patterns of the first inductor 12 and the second inductor 14 is more effectively suppressed than when only the IC chip 60B is provided, since electromagnetic field produced in the wiring patterns and passing through the IC chip 60B is blocked by the IC chip 60A covering the wiring patterns. Since the wiring patterns and the two IC chips 60A and 60B form a layered structure (superposed structure), the area occupied by the package IC (circuit apparatus) 1B is reduced as compared with a case where the wiring patterns of the first inductor 12 and the second inductor 14 and the IC chips 60A and 60B are provided in different areas on the same plane.

Like the IC chip 60, the IC chip 60A and the IC chip 60B may be a semiconductor element such as an LSI chip. More particularly, the IC chips may be a semiconductor element formed on a silicon substrate, an SiGe substrate or a GaAs substrate. Alternatively, the IC chip maybe a passive element in which a passive circuit element is formed on an $Al_2O_3$ substrate. Since the major portion of the IC chip is occupied by a substrate material, the dielectric constant of the IC chip is about 12-13, which is approximately equal to the dielectric constant of the substrate material.

Fourth Embodiment

Figure 17:
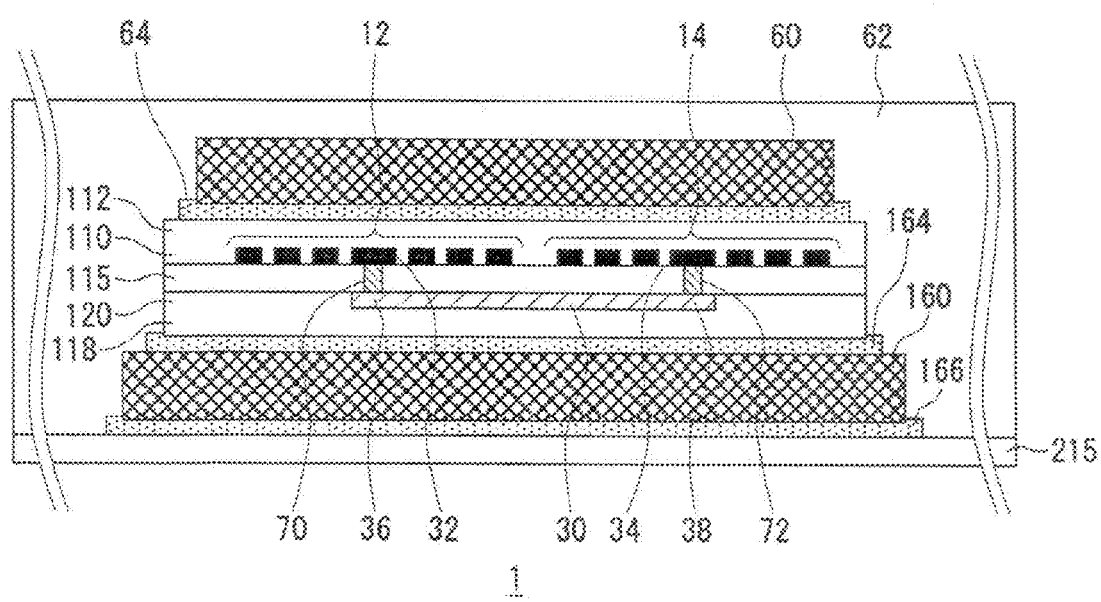
FIG. 17 is a sectional view showing the structure of a package IC according to a fourth embodiment.

FIG. 17 is a sectional view showing the structure of a package IC according to a fourth embodiment. The cross section of FIG. 17 corresponds to the B-B section of the structure of FIG. 3. A package IC (circuit apparatus) 1 according to the fourth embodiment is formed such that the sealing resin 62, the IC chip 60, the die-attach sheet 64, the coating layer (protective layer) 112, the first wiring layer 110, the dielectric layer 115, the second conductive layer 120, the coating layer 118, a die-attach sheet 164, an IC chip 160, a die-attach sheet 166 and a dielectric layer 215 are built one on top of another in the stated order. In the fourth embodiment, the dielectric layer 115 functions as an interposer. Referring to FIG. 17, the structure involving the sealing resin 62 through the coating layer 118 is similar to that of FIG. 5 except that the second wiring layer 120 is not provided with the conductive pattern 50 surrounding the bridge, as described later. The following description concerns the difference.

The die-attach sheet 166 is adhesively attached to the dielectric layer 215. The IC chip 160 is secured on the die-attach sheet 166. The die-attach sheet 164 is adhesively attached to the IC chip 160. The structure involving the IC chip 60 through the coating layer 118 is adhesively attached to the die-attach sheet 164. The IC chip 60 and the IC chip 160 are electrically connected to each other and to the first wiring layer 110 by means of, for example, wire bonding (not shown). Similarly to the dielectric layer 115, the dielectric layer 125 may be provided with a wiring layer or a conductive layer on a surface thereof or on both surfaces thereof (not shown in FIG. 17).

The outer edge of the IC chip 160 is outside the outer edge of the wiring patterns of the first inductor 12 and the second inductor 14 in the first wiring layer 110. Thus, in the fourth embodiment, the periphery of the IC chip 160 is designed to extend beyond the line delineating the periphery of the first wiring pattern and the second wiring pattern as a unit. That is, the IC chip 160 is located below the first wiring pattern of the first inductor 12. In this way, the IC chip 160 covers an area below the wiring patters of the first inductor 12 and the second inductor 14. As already described, the IC chip 60 is located above the wiring patterns of the first inductor 12 and the second inductor 14.

In the package IC 1 according to the fourth embodiment, the IC chip 60 suppresses upward electromagnetic leakage from the first inductor 12 and the second inductor 14. The IC chip 160 suppresses downward electromagnetic leakage from the first inductor 12 and the second inductor 14. Accordingly, there is no need to provide the conductive pattern 50 for suppressing downward electromagnetic leakage from the first inductor 12 and the second inductor 14, thereby making it easy to fabricate the package IC. Since the wiring patterns of the first inductor 12 and the second inductor 14, the IC chip 60 and the IC chip 160 form a layered structure, the area occupied by the package IC is reduced as compared with a case where they are provided in different areas on the same plane. If the lower surface or the underside of the IC chip 60 and the IC chip 160 is a ground layer, the ground layer also serves to reduce electromagnetic leakage from the first inductor 12 and the second inductor 14, enabling the IC chip 60 and the IC chip 160 to suppress electromagnetic leakage more effectively.

Fifth Embodiment

Figure 18:
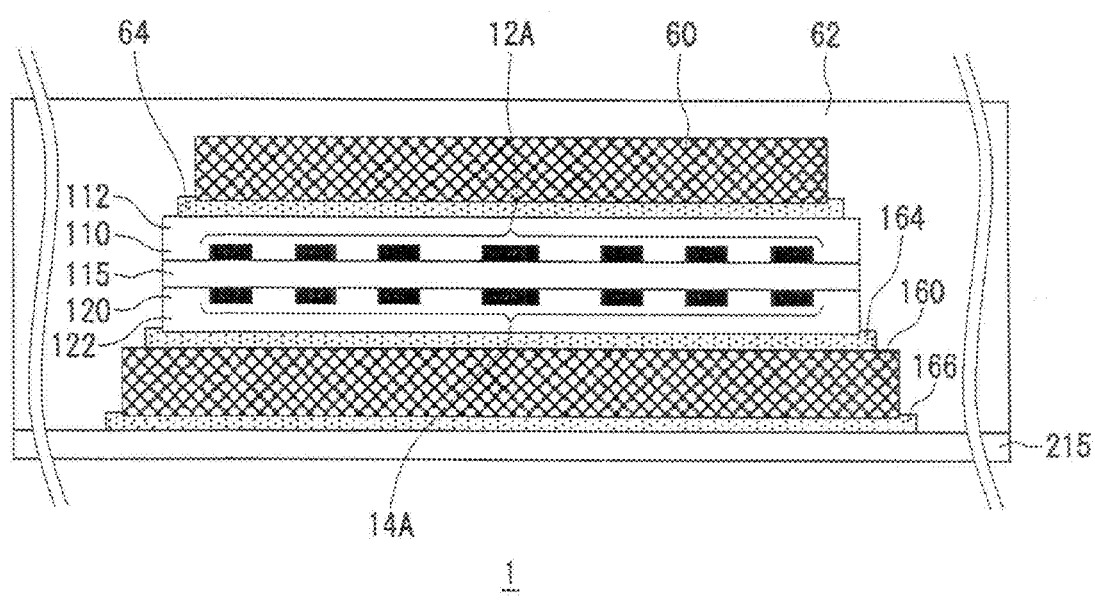
FIG. 18 is a sectional view showing the structure of a package IC according to a fifth embodiment.

FIG. 18 is a sectional view showing the structure of a package IC according to a fifth embodiment. The cross section of FIG. 18 corresponds to the B-B section of the structure of FIG. 3. A difference from the structure of FIG. 17 is that the coil patterns are laid out in a meandering configuration instead of a spiral configuration. A second difference is that one of the coil patterns of a meandering configuration is provided in the first wiring layer 110 and the other is provided in the second conductive layer 120 and is covered by the coating layer (protective layer) 122. The following description concerns the differences.

A third inductor 12A with a meandering coil pattern is formed on the first wiring layer 110. A fourth inductor 14A with a meandering coil pattern is formed on the second wiring layer 120. As described with reference to FIG. 17, downward electromagnetic leakage from the coil patterns is suppressed by the IC chip 160. Therefore, there is no need to provide the conductive pattern 50 in the second wiring pattern 120. This allows formation of the fourth inductor 14A in second first inductor 120. In this way, the area occupied by the IC package is further reduced as compared with a case where both the third inductor 12A and the fourth inductor 14A are formed in the first wiring layer 110.

Described above is an explanation based on the embodiments. The description of the embodiments is illustrative in nature and various variations in constituting elements and processes involved are possible. Those skilled in the art would readily appreciate that such variations are also within the scope of the present invention.

In the embodiments, a description is given of the circuit substrate structure 100 for an FM tuner. The circuit substrate structure 100 may be put to other uses. For example, the circuit substrate structure 100 may be used for a TV tuner or for a radio tag. Not only IC chips but also passive components may be mounted on the circuit substrate structure 100. In the embodiments, a description is given of a two-layer structure comprising two wiring layers. Alternatively, the substrate structure 100 may be formed to have a layered structure comprising three or more wiring layers. The circuit substrate structure 100 may be used to form a module or a sub-board as well as serving as a base for a package IC.

In the embodiments, the use of a MOS transistor as a transistor for high-frequency oscillation is described by way of example. Alternatively, a bipolar transistor may be used for high-frequency oscillation in the oscillation circuit 10. The bridge 30 may not necessarily connects between the first node 36 and the second node 38, or between the first node 36, the second node 38 and the third node 39 with a straight, minimal-length line. The bridge 30 may form a polygonal line or a curve. In this case, additional design flexibility is enjoyed.

The positions of the first node 36, the second node 38 and the third node 39 in the vertical direction may not match as illustrated. The positions in the vertical direction may be offset from each other. In this case, additional design flexibility is enjoyed. This is particularly true of a case as shown in FIGS. 9A-9B and FIGS. 10A-10B where the first inductor 12 and the second inductor 14 are formed in a rectangular configuration. In the variation shown in FIGS. 11A-11C and FIG. 12, node B connected to the control voltage input terminal 4 is formed in the first wiring layer 110, similarly to the structure of FIGS. 8A-8B. Alternatively, node B may be formed in the board 80. In this case, there is no need to form the third electrode 78 in the second wiring layer 120, which further reduces electromagnetic leakage outside the circuit substrate structure 100.

The spirally formed first wiring pattern and second wiring pattern may not necessarily be formed in a square or rectangular configuration as illustrated. The spirally formed first wiring pattern and second wiring pattern may be formed in a circular or elliptical configuration, or in a configuration of an arbitrary polygon. Although the description is given above of the formation of two coil patterns including the first inductor 12 and the second inductor 14, other wiring patterns may be formed in the first wiring layer 110. A via electrically connected to a wiring pattern is formed in the dielectric layer 115 also in this case. Formed in the second wiring layer 120 are the bridge 30 connected to the via and the conductive pattern 50 with its outer edge located outside the outer edge of the wiring patters in the first wiring layer 110. With this, the amount of electromagnetic field leaked downward from the wiring patterns and escaping outside the second wiring layer 120 is reduced. By allowing the bridge 30 to function as a coplanar line, the amount of electromagnetic leakage from the bridge 30 is also reduced.

In the embodiments, wire bonding is described by way of example as a means for electrical connection between the IC chip 60 and the first wiring layer 110. Alternatively, electrical connection between the IC chip 60 and the first wiring layer 110 may be established by other means. For example, the IC chip 60 may be mounted on the first wiring layer 110 by using flip-chip technology. In this case, it is ensured that the IC package is lightweight. Further, additional flexibility in designing the package IC 1 is enjoyed.

In the third embodiment, a description is given of a case where the outer edge of both two IC chips is outside the outer edge of the wiring patterns. Alternatively, the outer edge of one of the IC chips may be outside the outer edge of the wiring patterns in the first wiring layer. The amount of electromagnetic leakage in the upward direction is reduced by this provision. The other IC chip also reduces the amount of electromagnetic leakage in the upward direction by being located at a position that corresponds to the wiring patterns in the first wiring layer 110. In the circuit apparatus 1B as a whole, in which two IC chips are superposed, the amount of electromagnetic leakage is more successfully reduced than otherwise. In the fourth embodiment, a description is given of a case where the outer edge of the IC chip 160 is outside the outer edge of the wiring patterns of the first inductor 12 and the second inductor 14. Even if the outer edge of the IC chip 160 is not outside the outer edge of the wiring patterns of the first inductor 12 and the second inductor 14, the amount of electromagnetic field leaked downward is successfully reduced.

While a description is given in the third embodiment of case where two IC chips are superposed, three or more IC chips may be provided, the requirement being that the outer edge of at least one of the IC chips is outside the outer edge of the wiring patterns in the first wiring layer 110.

In the embodiments, a description is given of suppressing electromagnetic leakage both in the upward direction and downward direction with respect to the circuit apparatus provided with coil patterns. By providing the IC chip 60 above the circuit apparatus provided with wiring patterns, electromagnetic leakage at least in the upward direction is suppressed. In the embodiments, a description is given of locating the IC chip 60 so as to cover the entirety of the coil patterns. It will be appreciated naturally that, by covering locating the IC chip 60 so as to cover a portion of the coil patterns, electromagnetic leakage from the coil patterns is suppressed at least in the portion covered by the IC chip 60.

While the preferred embodiments of the present invention have been described using specific terms, such description is for illustrative purposes only, and it is to be understood that changes and variations may be made without departing from the spirit or scope of the appended claims.

What is claimed is:

1. A circuit apparatus comprising:
   a dielectric layer;
   a wiring layer provided on one surface of the dielectric layer and provided with a wiring pattern formed as a coil;
   a circuit element superposed on the wiring pattern, an outer edge of the circuit element being located outside an outer edge of the wiring pattern in the wiring layer; and
   a protective layer covering the wiring layer, wherein the circuit element is provided above the protective layer via a non-conductive adhesive layer.

2. The circuit apparatus according to claim 1, further comprising another circuit element provided on another surface of the dielectric layer at a position opposite to the wiring pattern via the dielectric layer.

3. The circuit apparatus according to claim 1, further comprising:
   another wiring layer provided on the other surface of the dielectric layer and provided with a wiring pattern formed as a coil; and
   another circuit element superimposed on the wiring pattern in the other wiring layer, the outer edge of the other circuit element being located outside an outer edge of the wiring pattern in the other wiring layer.

4. The circuit apparatus according to claim 1, further comprising a conductive layer provided on the other surface of the dielectric layer, an outer edge of the conductive layer being located outside the outer edge of the wiring pattern in the wiring layer.

5. The circuit apparatus according to claim 4, wherein the wiring pattern formed as a coil is formed in a meandering configuration.

6. The circuit apparatus according to claim 4, wherein the conductive layer extends to underlie at least the entirety of the circuit element.

7. The circuit apparatus according to claim 1, further comprising a sealing resin which seals the circuit element.

8. The circuit apparatus according to claim 1, wherein the circuit element comprises a first circuit element and a second circuit element superimposed on each other, an outer edge of the first circuit element being located outside the outer edge of the wiring pattern in the wiring layer and an outer edge of the second circuit element being arbitrarily located.

9. The circuit apparatus according to claim 8, wherein the second circuit element is superposed on the first circuit element, an outer edge of the second circuit element being located outside the outer edge of the wiring pattern in the wiring layer.

10. The circuit apparatus according to claim 1, wherein the wiring pattern comprises a first wiring pattern of a spiral configuration and a second wiring pattern of a spiral configuration, and the dielectric layer is provided with a first via and a second via electrically connected to the first wiring pattern and the second wiring pattern, respectively, the circuit apparatus further comprising another wiring layer comprising:
    a bridge electrically connecting the first via and the second via; and
    a conductive pattern provided around the bridge, an outer edge of the conductive pattern being located outside outer edges of the first wiring pattern and the second wiring pattern in the wiring layer.

11. The circuit apparatus according to claim 10, wherein the bridge is surrounded by the conductive layer and functions in the other wiring layer as a coplanar line.

12. The circuit apparatus according to claim 11, wherein the characteristic impedance of the coplanar line is set lower than the characteristic impedance of the first wiring pattern or the second wiring pattern.

* * * * *